US006714564B1

(12) United States Patent
Meyers

(10) Patent No.: US 6,714,564 B1
(45) Date of Patent: Mar. 30, 2004

(54) DUAL FUNCTION SINGLE LASER

(75) Inventor: Brad E. Meyers, Redmond, WA (US)

(73) Assignee: B. E. Meyers & Co., Inc., Redmond, WA (US)

( * ) Notice: Subject to any disclaimer, the term of this patent is extended or adjusted under 35 U.S.C. 154(b) by 134 days.

(21) Appl. No.: 09/591,248

(22) Filed: Jun. 9, 2000

Related U.S. Application Data

(60) Provisional application No. 60/150,283, filed on Aug. 23, 1999.

(51) Int. Cl.[7] .............................. H01S 3/10; F41G 1/35; G02B 9/04
(52) U.S. Cl. ............................. 372/9; 359/727; 372/24
(58) Field of Search .............................. 372/24, 101, 9; 356/153; 42/115, 117, 123, 131, 146; 362/110; 434/21; 354/691, 692, 717, 727, 793; 359/795

(56) References Cited

U.S. PATENT DOCUMENTS

| 4,876,816 A | * | 10/1989 | Triplett ...................... 42/115 |
| 5,146,463 A | * | 9/1992 | Rando ........................ 372/24 |
| 5,206,674 A | * | 4/1993 | Puech et al. ................. 353/122 |
| 5,298,971 A | * | 3/1994 | Huang et al. ................ 356/353 |
| 5,589,930 A | * | 12/1996 | Kurahashi et al. .......... 356/5.01 |
| 5,629,767 A | * | 5/1997 | Tchejeyan ................... 356/153 |
| 5,643,252 A | * | 7/1997 | Waner et al. ................. 606/9 |
| 5,745,287 A | * | 4/1998 | Sauter ........................ 359/428 |

FOREIGN PATENT DOCUMENTS

JP          08-313198 A   *  11/1996   ............. H01S/3/00

* cited by examiner

Primary Examiner—Paul Ip
(74) Attorney, Agent, or Firm—Dorsey & Whitney LLP

(57) ABSTRACT

The invention is a dual function laser device for use in night vision systems. The invention uses lenses to cause one portion of a laser beam to converge to a target point and another portion of the beam to diverge. The divergent portion is variable in size and illuminates a viewable area around the target point. Rather than use two lasers to create an illuminated view area around an illuminated target point, the invention uses a combination of a lens and a sub-aperture lens arrangement to create two illuminations from a single laser.

19 Claims, 10 Drawing Sheets

FIG. 10
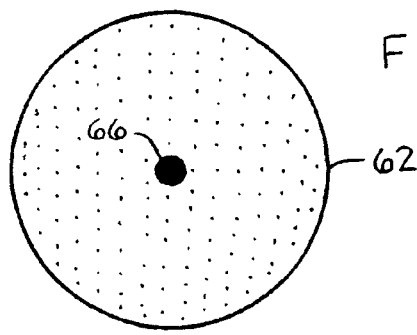
FIG. 11
FIG. 12
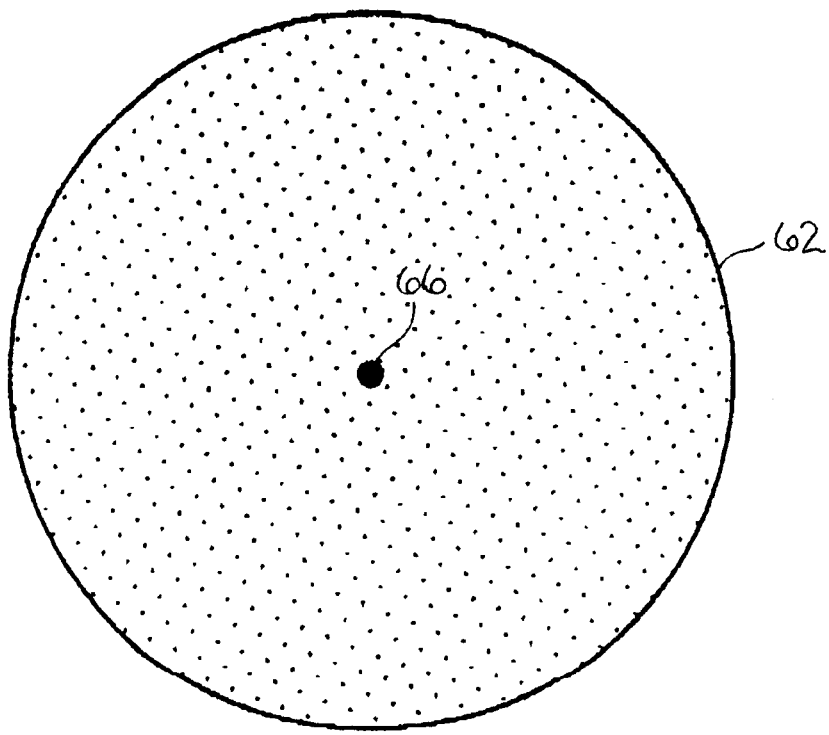

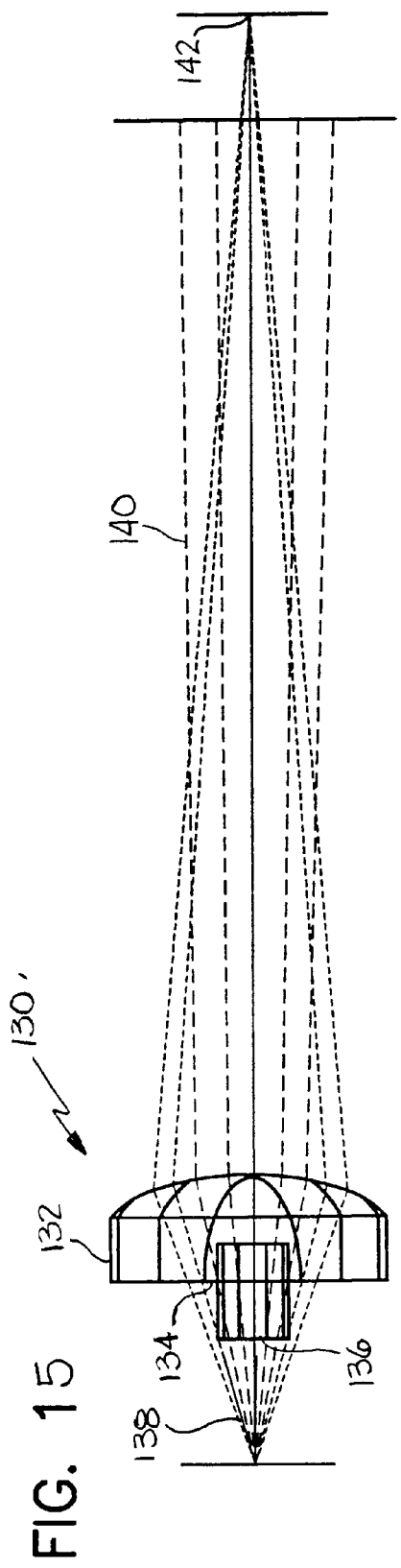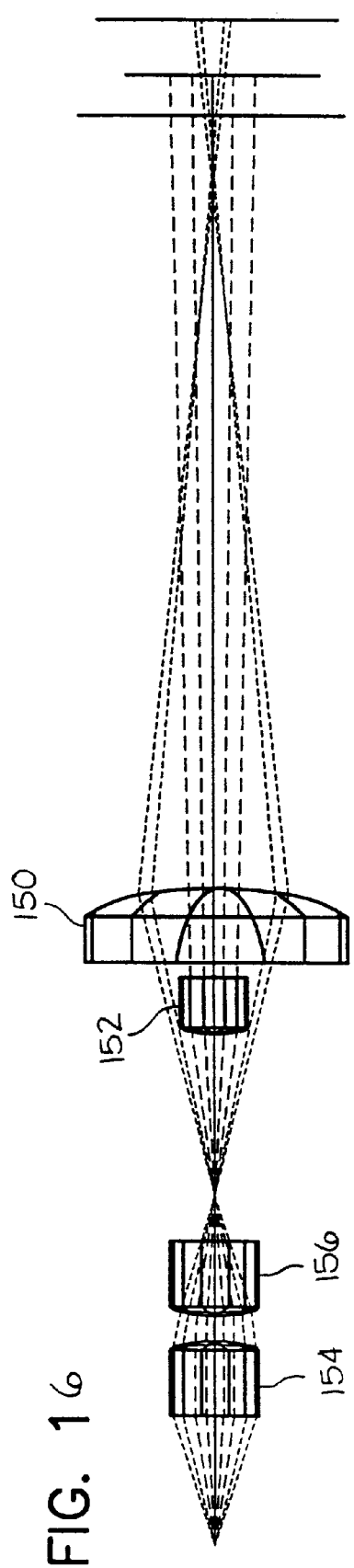
FIG. 15
FIG. 16

DUAL FUNCTION SINGLE LASER

CROSS REFERENCE TO A RELATED APPLICATION

This application is copending with U.S. provisional application No. 60/150,283 filed Aug. 23, 1999. The benefit of the filing date of that application is hereby claimed.

TECHNICAL FIELD OF THE INVENTION

The present invention relates to novel devices for illuminating a target with a coherent beam of radiant energy, typically, although not necessarily, operating in the covert, near infrared portion of the electromagnetic spectrum, and capable of functioning simultaneously as both a source of illumination and a pointing device.

In the interest of brevity and clarity, the principles of the present invention will be developed in large part with reference to target illumination and aiming. This is not intended to limit the scope of the invention as defined in the appended claims as there are many other applications of sub-laser illuminators employing these principles such as medical technology or surveying.

BACKGROUND OF THE INVENTION

The invention disclosed here is an improvement on the type of night vision system disclosed in U.S. Pat. No. 5,056,097 entitled TARGET ILLUMINATORS AND SYSTEMS EMPLOYING SAME ("the '097 patent") which is hereby incorporated by reference into this specification. The '097 patent disclosed a night vision target illumination device that uses a laser to provide illumination. The illumination device is an "infrared laser" system. In other words, the laser is used to illuminate a target area that is invisible to the naked eye and can only be seen by viewing the target area through an image intensifier or other infrared sensing device.

An important advantage of a laser-based device over earlier designs (i.e., LED-based devices) is that the laser-based device can illuminate a target area at a much greater distance. Earlier LED-based devices were limited in their ability to produce adequate visual images at ranges approaching 500 feet and beyond. Laser-based devices are limited only by their power output.

The laser-based system can be built with a zoom function that allows adjustment of the size of the illuminated target area. Obviously, enlarging the target area gives the user a wider field of view. But, the laser can also be focused to a point (i.e., "target point") and therefore function as an invisible targeting device (i.e., "gun sight").

The use of visible lasers as gun sights for weapons targeting is, of course, well known and has been used by the military, police SWAT teams, and the like. They create a targeting point or spot (e.g., a red "dot") that is visible to the naked eye. In the case of the invisible laser, the target point can be seen only through special infrared or night vision imaging devices.

If the invisible laser is focused to a small target point in the dark, then the user (who views the area illuminated by the laser through the night vision imaging devices) cannot see anything in the dark but the target point itself. Consequently, heretofore invented has been a dual laser system that uses one laser for the targeting point function and a second laser to create a larger, viewable field around the target point. By taking advantage of the features of the dual laser system, the user can see where the target point should be moved as necessary.

SUMMARY OF THE INVENTION

The present invention is an improvement over the dual laser system described above.

The invention disclosed herein is a dual function, single laser device. Rather than using two laser emitters, the device uses a single laser in combination with a unique arrangement of lenses to produce both a "targeting" function (pinpoint dot) and a variable sized "field of illumination" function as described above. This is accomplished by placing a first lens downstream of a laser diode for focusing the laser's beam along a converging path. A second lens arrangement is positioned within the envelope of the beam path and fans a portion of the beam outwardly along a diverging path. The first lens is used to focus a portion of the laser's beam to a target point for sighting purposes. The second lens arrangement causes a central portion of the beam to spread outwardly and create an illumination field around the target point.

The second lens arrangement can be made in different ways. One type of lens arrangement uses a pair of sub-aperture lenses positioned downstream of the first lens, but still within the "footprint" of the laser beam after it passes through the first lens. The specific details of this particular embodiment, and others, are described below.

The invention provides many advantages over existing laser-based devices. By using lenses to create both the targeting and viewing functions, one laser emitter can do the job of two. An advantage of using a single laser emitter is that a laser targeting device can be simplified and made at lower carrying weight and reduced cost relative to prior designs. When two laser emitters are used, each requires its own electronics and power. Therefore, reducing the number of emitters from two to one significantly simplifies the design, and reduces the cost of an invisible targeting device.

The objects, advantages, and features of the present invention will be apparent to the reader from the foregoing and the appended claims, and as the ensuing detailed description and discussion of the invention proceeds in conjunction with the accompanying drawings.

BRIEF DESCRIPTION OF THE VARIOUS VIEWS OF THE DRAWINGS

In the drawings, like reference numerals refer to like parts throughout the various views unless indicated otherwise, and wherein:

FIG. 10 illustrates the appearance of the beam produced by the lens arrangement shown in FIG. 7;

FIG. 11 illustrates the appearance of the beam produced by the lens arrangement shown in FIG. 8;

FIG. 12 illustrates the appearance of the beam produced by the lens arrangement shown in FIG. 9;

FIGS. 15–17 are views like FIGS. 13 and 14, showing still other alternative lens configurations.

DETAILED DESCRIPTION OF THE INVENTION

Figure 1:
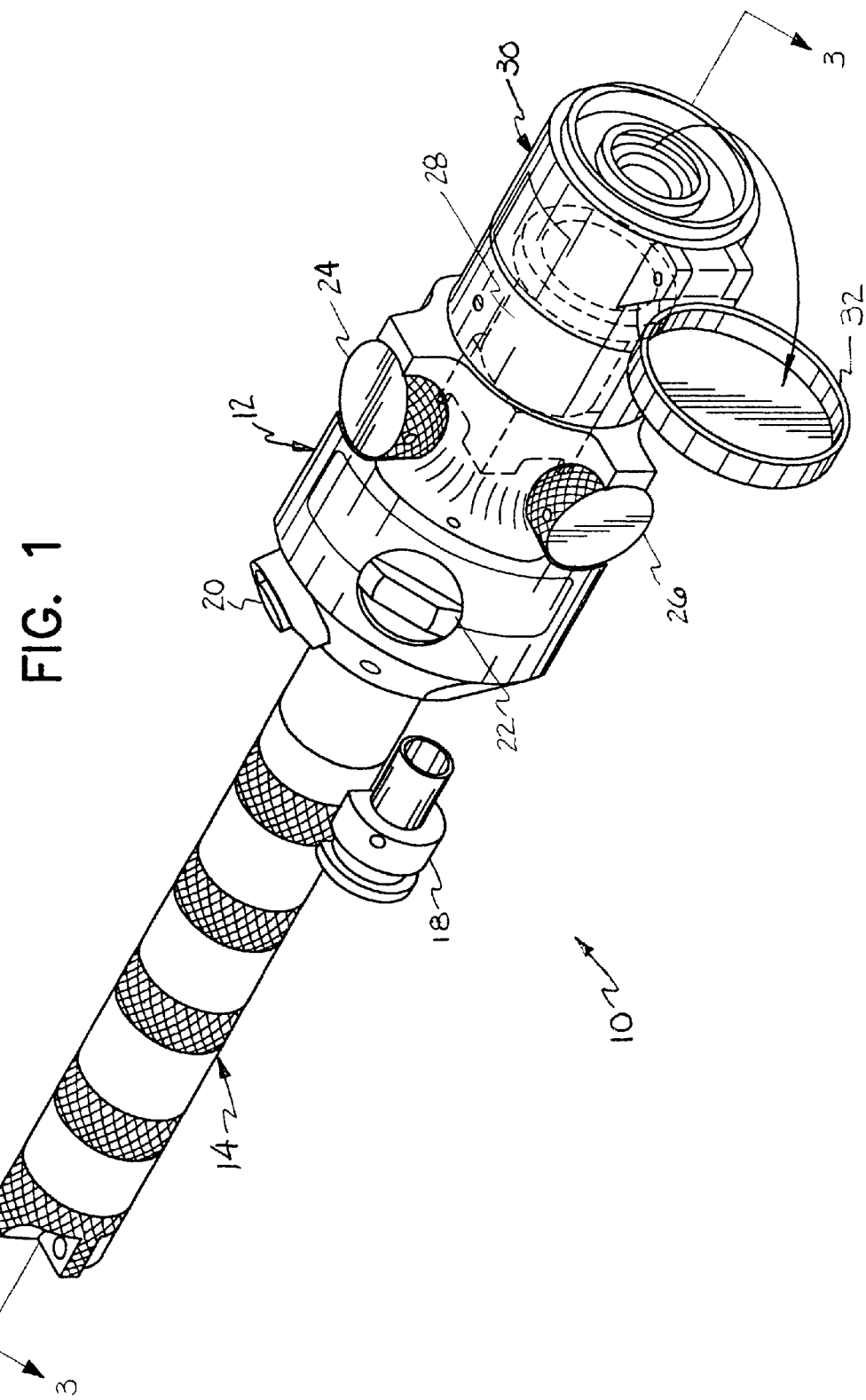
FIG. 1 is a pictorial view of a dual function single laser device of the present invention.

Referring now to the drawings, FIG. 1 depicts a dual function, single laser device (the "DFSL device") of the present invention generally at 10. The DFSL device 10 includes a main housing 12 and a battery housing 14. Batteries (not shown) in this case supply the power for operating the DFSL device 10, and may be inserted or removed from battery housing 14 via a removable closure cap 16 located near the proximal end of the battery housing. Battery housing 14 is removable from the main housing 12 and may be replaced by other optional battery housing elements designed to receive various types of batteries which the user may select based on size, weight or power longevity considerations.

Main housing 12 includes push button switch 20, main switch 22, vertical focusing knob 24, horizontal focusing knob 26, laser focusing assembly 28 (shown in broken lines), a rotatable type projection zoom lens 30, and cover element 32 pivotally connected to projection zoom lens 30.

Figure 2:
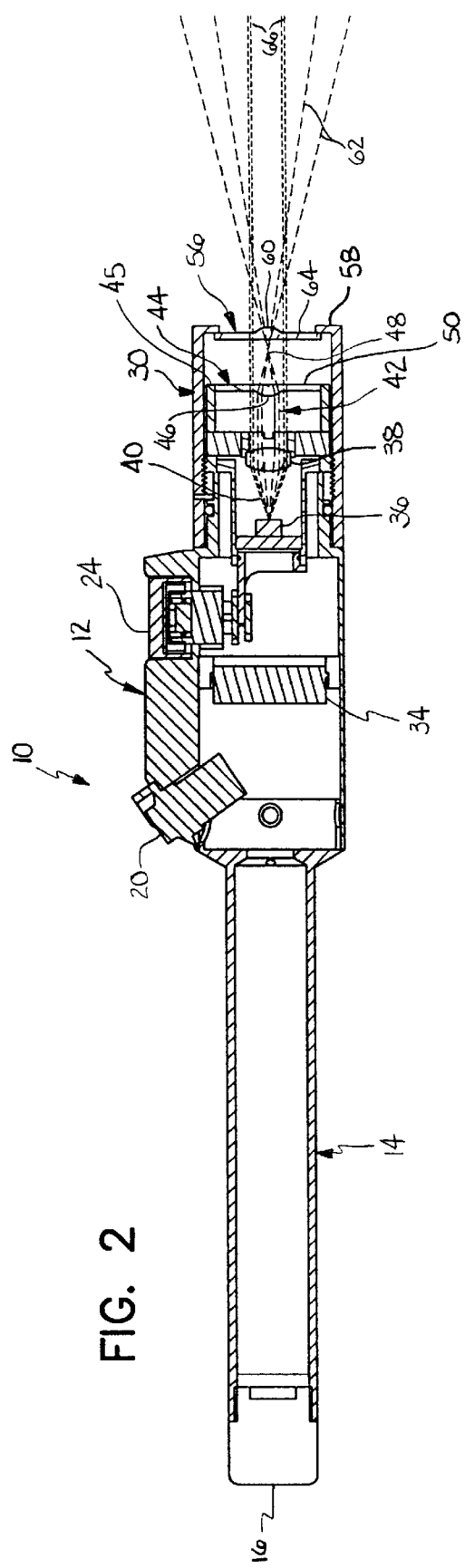
FIG. 2 is a cross-sectional view of the dual function single laser device, taken substantially along line 3—3 of FIG. 1, showing the internal functional components of the device.
Figure 3:
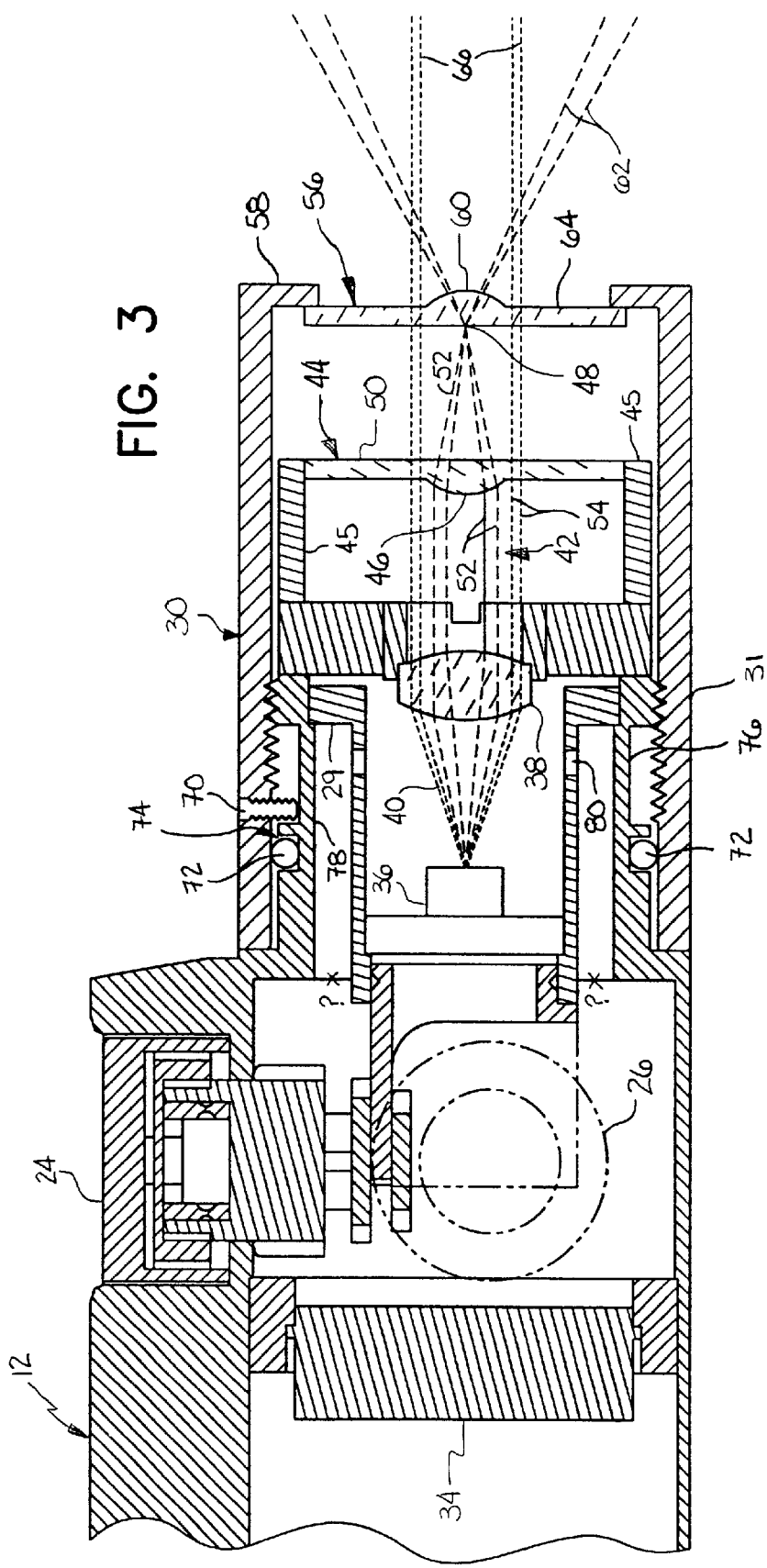
FIG. 3 is an enlarged cross-sectional view of a portion of FIG. 2, showing a secondary lens in a retracted position.
Figure 4:
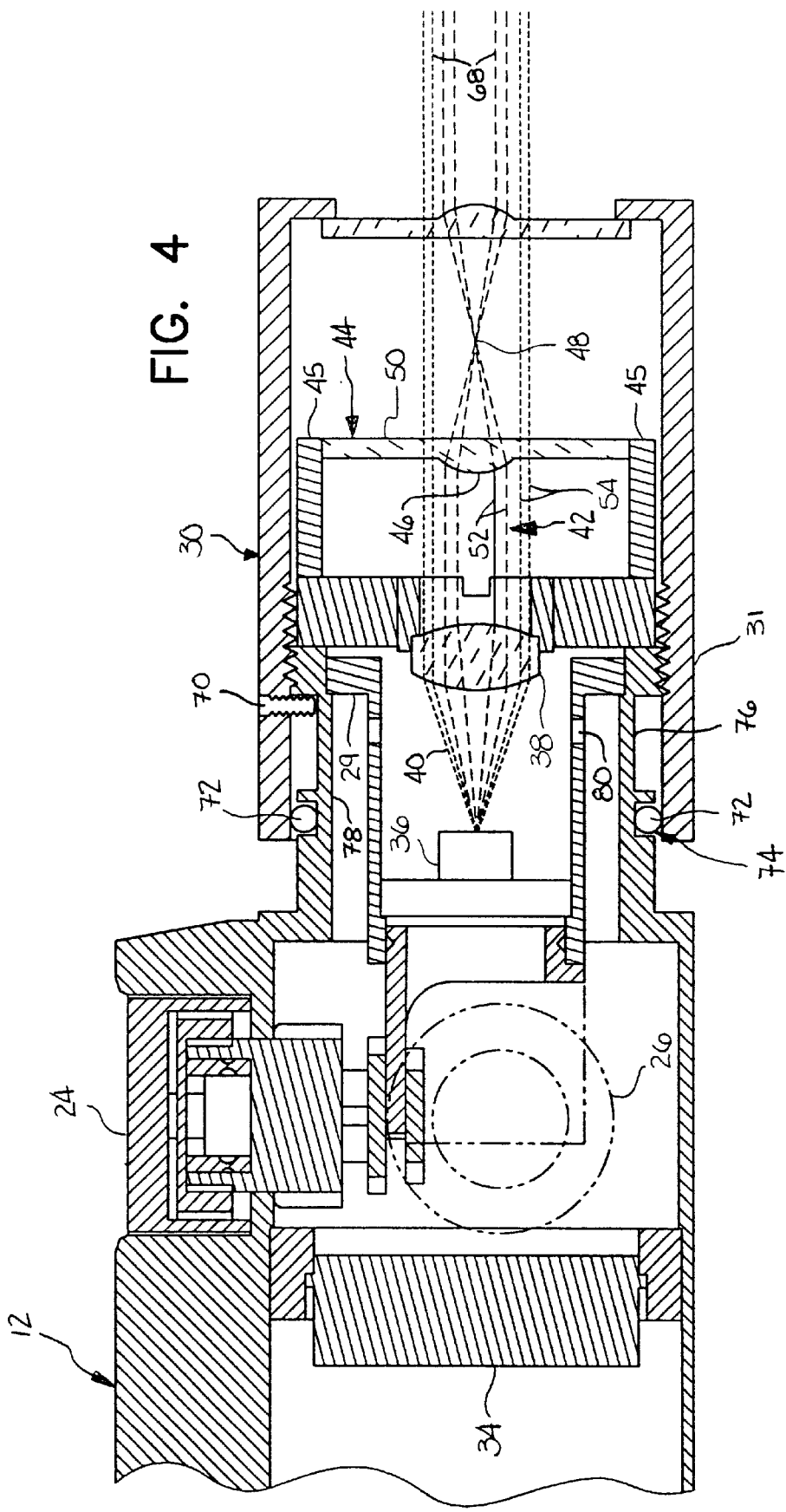
FIG. 4 is an enlarged cross-sectional view like FIG. 3, showing a secondary lens in an extended position.

Having observed the details of these basic components of the DFSL device 10, attention may now be given to the functional interaction of these components with the internal system components of the present invention. Referring now to FIGS. 2–4, cross-sectional views of the DFSL device 10 of FIG. 1 are illustrated.

Batteries (not shown), contained in battery housing 14 provide a power source for electronics package 34 which in turn powers laser diode 36. Because the electronics are not an aspect of the present invention, the reader is referred to a description of the laser driver module and power supply schematics in the '097 specification. When the main switch 22 (see FIG. 1) has been placed in the "On", or an operational position, laser diode 36 may be activated by user actuation of push button switch 20 or remotely via connection with a multipurpose arming plug 18 located on battery housing 14. Multipurpose arming plug 18 must be engaged with a key plug (not shown) or its equivalent before the DFSL device can be activated via main switch 22 or push button switch 20.

The illustrated DFSL device 10 is supplied with a 100 mW laser diode 36 operating at a frequency in the near infrared portion of the electromagnetic spectrum, or other device as the type used in the device disclosed in the '097 specification. Laser diodes are familiar to those skilled in the art. When activated, the laser 36 emits a coherent stream of radiant energy 40 at a particular wavelength. The emitted radiant energy 40 passes through a main focusing bi-convex lens 38 wherein it is formed into a well defined beam 42. This beam of radiant energy 42 is then passed through a primary lens assembly 44. Primary lens assembly 44 includes a centrally-positioned, positive planar convex lens 46 within the envelope or "footprint" of beam 42, and is supported at each end by lens holder 45. Because lens 46 is positioned entirely within the "footprint" of beam 42, a first portion of beam 42, referenced in FIGS. 3 and 4 at 52, passes through lens 46 and converges to focal point 48. The remaining second portion of beam 42, referenced in FIGS. 3 and 4 at 54, passes around lens 46 through the planar, transparent portion 50 of primary lens assembly 44.

Referring now specifically to FIGS. 2 and 3. Beam 46, after having been passed through primary lens assembly 44, is passed through a secondary lens assembly 56 which is fixedly connected to projection zoom lens 30 at circumferentially extending band 58. The first portion 52 of beam 46 passes through negative planar convex lens 60 and diverges to create illumination beam 62. As with lens 46, lens 60 is positioned within the "footprint" of beam 42 and the second portion 54 of beam 42 passes around lens 60 through the planar, transparent portion 64 of secondary lens assembly 56 to create pointing beam 66.

The down range diameter of the illumination beam 62 varies with the spaced relationship of secondary lens assembly 56 and primary lens assembly 44. When projection lens 30 and attached secondary lens assembly 56 are in a fully extended position (see FIG. 4), the first portion 52 of beam 42 is refracted by lens 60 so that its path is parallel with the second portion 54 of beam 42 resulting in the creation of focused pointing beam 68 without a corresponding illumination beam. This spatial arrangement of the primary and secondary lens assemblies will be referred to as focused dot mode.

A set screw 70 provides a stop to prevent projection zoom lens assembly 30 from being overly extended or removed. O-ring 72 fits into a groove 74 machined into the exterior surface of main housing 12 prior to engagement with projection zoom lens assembly 30. The O-ring 72 is employed to keep foreign material from penetrating between tubular housing 31 and guide member 76 of main housing 12.

Figure 5:
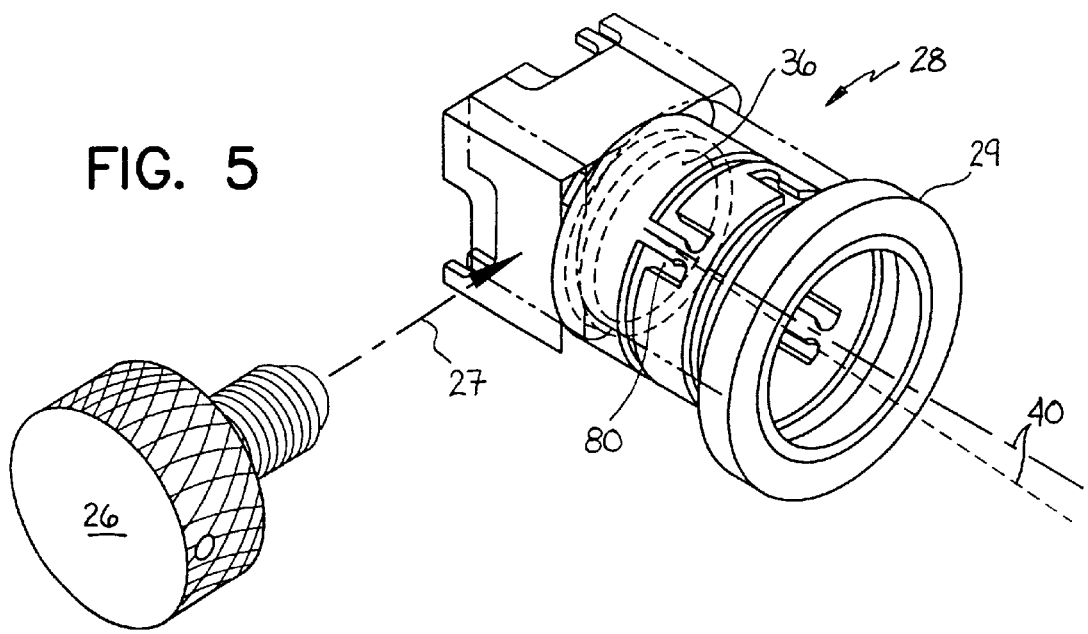
FIG. 5 is an illustration, showing the movement of the laser focusing assembly, shown with broken lines at 28 in FIG. 1 in response to rotation of the horizontal focusing knob.
Figure 6:
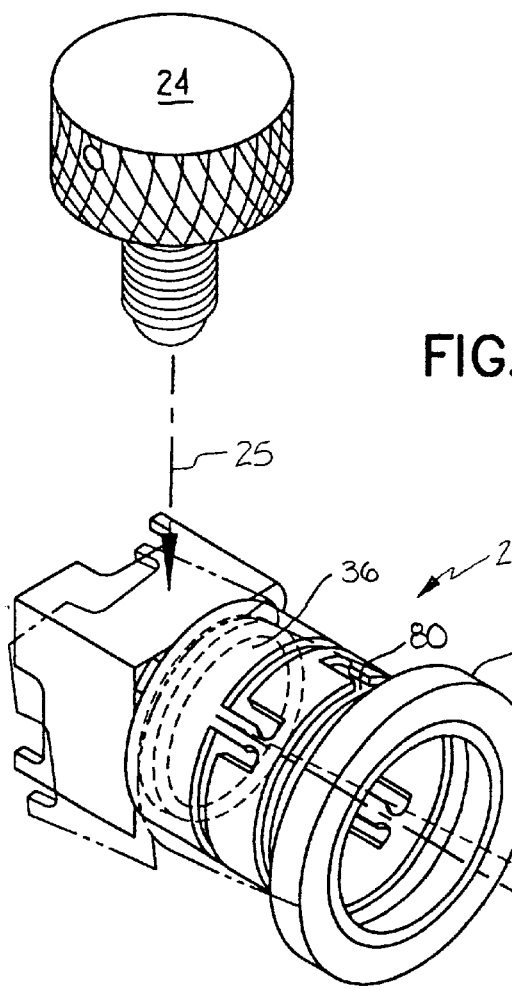
FIG. 6 is like FIG. 5, and shows the movement of the laser focusing assembly in response to rotation of the vertical focusing knob.

Referring now primarily to FIGS. 5 and 6, pointing beam 66 (see FIG. 2) creates a focused dot relative to an object downrange of the DFSL device. When used in the context of targeting, it is advantageous to provide a focusing feature with respect to the pointing beam 66 so that it can be adjusted relative to the impact point (i.e. from a bullet) to ensure complete targeting accuracy. To this end, vertical and horizontal focusing knobs 24, 26 provide an adjustment mechanism for beam alignment through click-stop movement.

Each focusing knob can be advanced or backed off by rotation of the respective knob in its threaded container (not shown). Rotation of vertical focusing knob 24 imparts a movement to laser focusing assembly 28 along axis 25, while rotation of horizontal focusing knob 26 imparts a corresponding movement to laser focusing assembly 28 along axis 27. The adjusted positions of laser focusing assembly 28 are illustrated in FIGS. 5 and 6 by broken lines as is the corresponding radiant energy 40 emitted from laser diode 36.

Supporting ring member 29 (FIGS. 3–6) is fixedly connected to the inner surface 78 of guide member 76. Focusing movement is imparted to the otherwise rigid structure of laser focusing assembly 28 by way of flex channels 80 machined into the surface of assembly 28.

Figure 7:
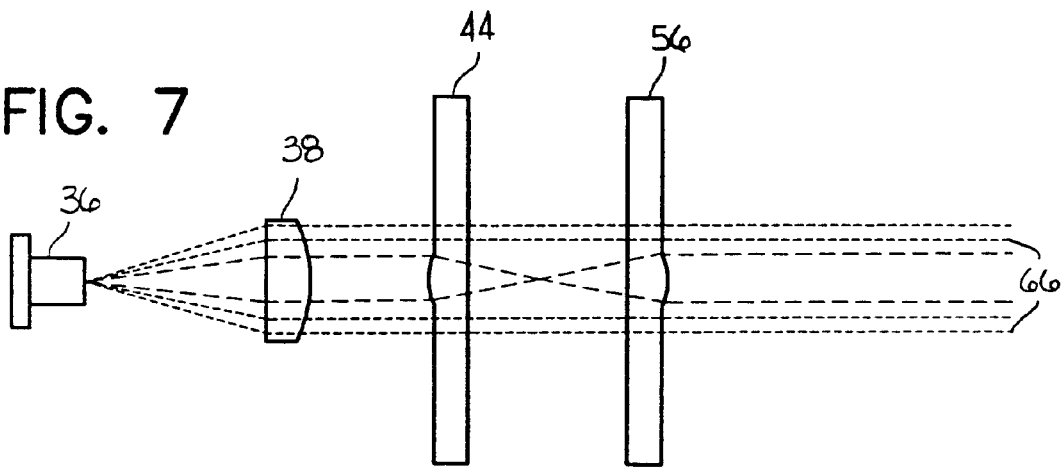
FIG. 7 is a schematic illustration of the lens arrangement corresponding to focused dot mode.
Figure 8:
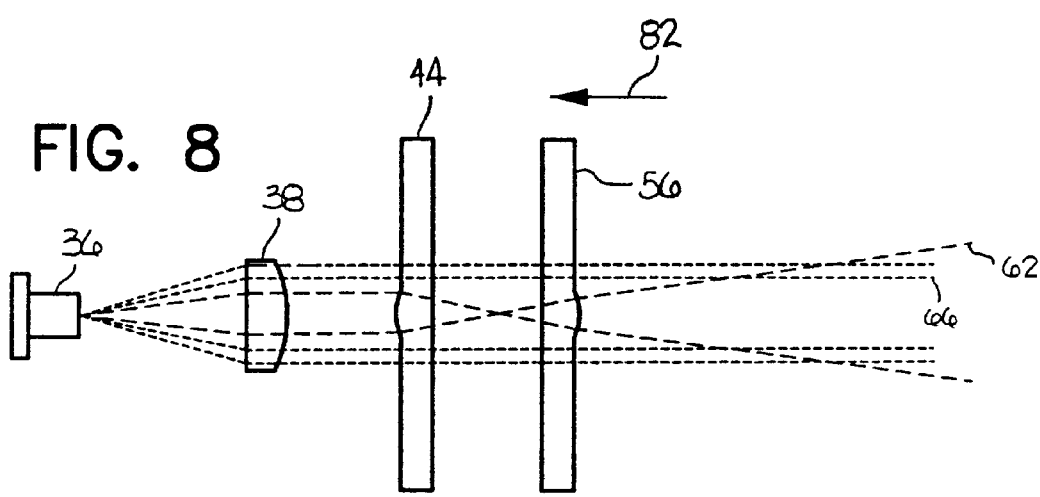
FIG. 8 is like FIG. 7, and illustrates the lens arrangement corresponding to a simultaneous focused dot and flood mode.
Figure 9:
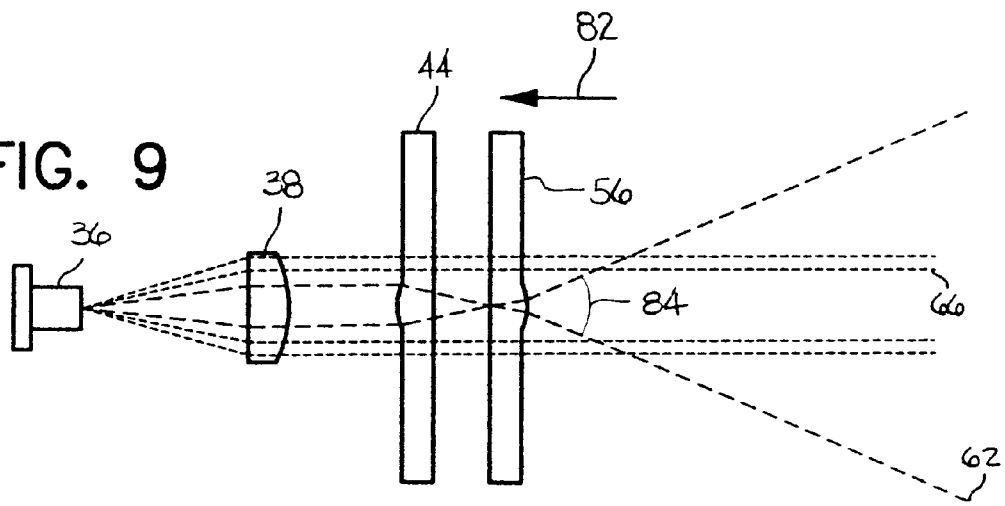
FIG. 9 is like FIGS. 7 and 8, and illustrates the lens arrangement corresponding to another simultaneous focused dot and flood mode in which the illumination beam is expanded to encompass a greater area.

FIGS. 7–9 illustrate the spatial relationship between the primary and secondary lens assemblies 44, 56, and the corresponding beam or beams of radiant energy resulting therefrom. FIG. 7 illustrates the relationship of the two lens assemblies in the focused dot mode wherein only a pointing beam 66 is generated. FIG. 8 illustrates one of a plurality of intermediate relationships between the two lens assemblies wherein both a pointing beam 66 and an illumination beam 62 are generated. These intermediate arrangements are realized by rotation of the projection zoom lens which in turn moves secondary lens assembly 56 toward primary lens assembly 44 as indicated by the arrow 82 in FIGS. 8 and 9.

FIG. 9 illustrates the spatial relationship of the lens assemblies when the projection zoom lens has been fully retracted, placing secondary lens assembly 56 in the nearest position in regard to the more divergent illumination beam 62 resulting in a wider "field of view" in the downrange beam appearance.

The downrange beam appearance resulting from each lens assembly arrangement in FIGS. 7–9 is illustrated in FIGS. 10–12 respectively. Pointing beam 66 appears as a focused dot, while illumination beam 62 has a diameter proportionate to its diverging angle 84 (see FIG. 9) as it passes from secondary lens assembly 56.

Figure 13:
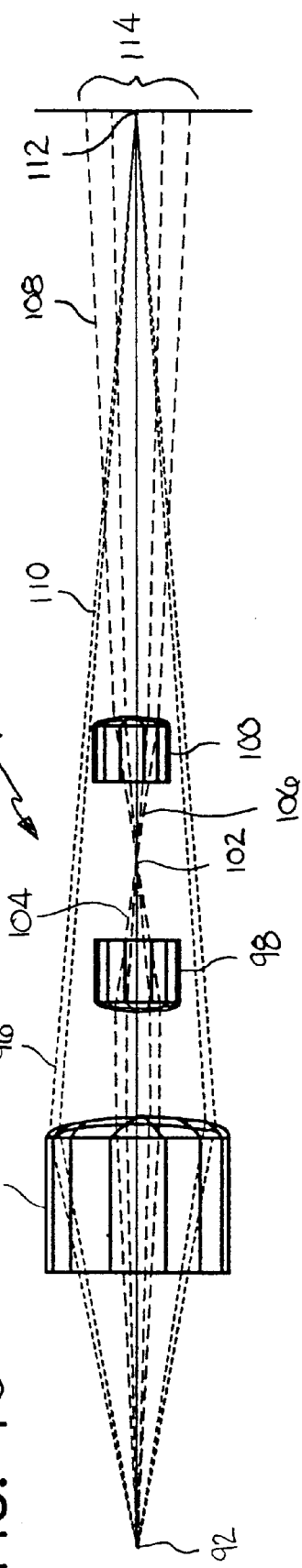
FIG. 13 is a schematic view of a lens arrangement that creates dual function illumination from the same laser diode.

Referring now to FIG. 13, shown generally at 90 is a lens configuration, similar to those illustrated in FIGS. 7–9, that will provide dual-function illumination from a single laser device. The position of the laser emitter is indicated at 92.

Light from the laser emitter or diode at 92 passes through a first positive lens, indicated at 94. The first lens 94 causes the light beam to converge downstream of the lens, as indicated generally at 96. A pair of sub-aperture lenses 98, 100 are positioned downstream of the first lens, but within the envelope or "footprint" of the light beam 96. Therefore, as described previously, a portion of the beam passes around the sub-aperture lenses while another portion passes through them.

The sub-aperture lenses 98–100 illustrated in FIG. 13 are "positive-negative" lenses. A person skilled in optics will be familiar with this terminology and the types of lenses used to create the effect that is illustrated. As mentioned previously, a portion of the light beam 96 passes through the first lens 98 of the sub-aperture arrangement and then converges toward and then diverges beyond a focal point 102. The convergence is indicated at 104 and the divergence is indicated at 106. The divergent portion 106 passes through the second sub-aperture lens 100 which "fans" that portion of the beam outwardly or divergently, as shown at 108.

The portion of the beam 96 that does not pass through the sub-aperture lenses, indicated generally at 110 downstream of the sub-aperture lenses 98, 100, continues to converge to a focal point 112. The net effect is that the sub-aperture lenses fan a portion of the beam into a wider area of illumination, indicated by the bracket 114 in FIG. 13, while that portion of the beam that passes around the sub-aperture lenses 98, 100 is focused to a point. When the lens arrangement 90 is used as a targeting device with an invisible laser diode, the downstream focal point 112 can function as a highly precise gun sight, while the fanned area 114 allows the surrounding area to be viewed.

The lens arrangement illustrated in FIG. 13 is a preferred configuration for creating a dual-function laser as described above. However, the same dual function from a single laser diode may be achieved through the use of different lens arrangements. Examples of other lens configurations are illustrated in FIGS. 14–17.

Figure 14:
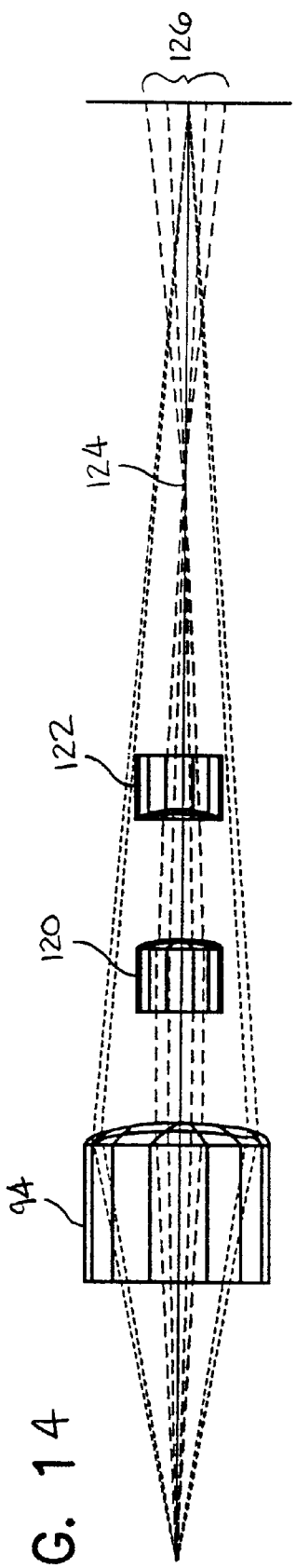
FIG. 14 is a view similar to FIG. 13, showing a alternative lens configuration that may be suitable for providing the dual illumination function.

Referring first to FIG. 14, the positive-negative sub-aperture lenses 98, 100 shown in FIG. 13 are replaced by an arrangement of positive-positive sub-aperture lenses 120, 122. This particular arrangement moves the sub-aperture focal point 124 downstream of the lenses 120, 122. The interior portion of the beam then fans outwardly from the focal point 124 to create the field of illumination indicated by bracket 126.

The lens arrangement 130 shown in FIG. 15 may also be used to create a dual function effect. The first lens 132 has a bore or opening 134 extending through the lens in which a second lens 136 is placed. A portion of the second lens 136 is physically upstream of the first lens 132. Second lens 136 captures an interior portion of the laser light 138 and fans it outwardly through the first lens 132, as shown at 140. The first lens 132 otherwise converges the remainder of the beam to a point 142.

Figure 17:
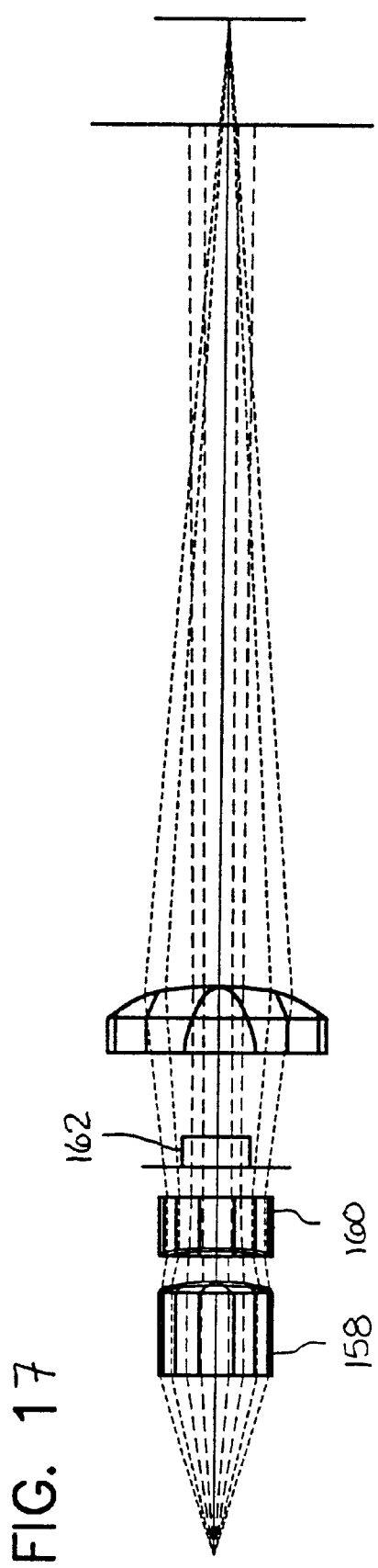

Still other lens configurations are illustrated in FIGS. 16 and 17. These represent configurations that may enable longer optical paths for targeting purposes. FIG. 16 illustrates a lens arrangement 150, 152 that is somewhat similar to the arrangement illustrated in FIG. 15. However, upstream of lenses 150, 152 are a pair of positive re-imager lenses 154, 156. The arrangement illustrated in FIG. 17 is a further variation on the arrangement illustrated in FIG. 16. The FIG. 17 arrangement uses a positive-negative pair of re-imager lenses 158, 160 in combination with a smaller, downstream lens 162.

While the invention is described and illustrated here in the context of a targeting device and with particular lens configurations, the invention may be embodied in many forms without departing from the spirit or essential characteristics of the invention. The present embodiment is therefore to be considered in all respects as illustrative and not restrictive. The scope of the invention is indicated by the appended claims rather than by the foregoing description, and all changes which come within the meaning and range of equivalency of the claims are intended to be embraced therein.

What is claimed is:

1. An apparatus for illuminating and targeting a target, comprising:
   a light source emitting a beam toward the target;
   a positive convex-planar lens positioned in the beam that refracts a first portion of the beam along a convergent path to a first focal point and that transmits an unrefracted second portion of the beam; and
   a negative planar-convex lens positioned in the beam downstream of the positive convex-planar lens and spaced apart from the positive convex-planar lens, the negative planar-convex lens transmitting at least part of the second portion to form a targeting dot on the target, the negative planar-convex lens refracting at least part of the first portion of the beam to form a relatively larger illuminating footprint on the target, the negative planar-convex lens being coupled to a translating mount configured to translate the negative planar-convex lens relative to the positive convex-planar lens.

2. The apparatus according to claim 1 wherein the negative planar-convex lens is spaced apart from the first lens such that the first focal point is upstream of or coincident with the negative planar-convex lens.

3. The apparatus according to claim 1 wherein the first focal point is downstream of the negative planar-convex lens.

4. The apparatus according to claim 1 wherein the first portion of the beam is an inner portion and the second portion of the beam is annularly disposed about the inner portion.

5. The apparatus according to claim 1 wherein the first portion of the beam is a circular portion and the second portion of the beam is annularly disposed about the circular portion.

6. The apparatus according to claim 1 wherein a third portion of the first portion of the beam is not refracted by the negative planar-convex lens, the third portion being approximately collimated at the target.

7. The apparatus according to claim 1, further comprising a third lens positioned intermediate the positive convex-planar and negative planar-convex lenses.

8. The apparatus according to claim 1, further comprising a housing having a first member coupled to the positive convex-planar lens and a second member coupled to the negative planar-convex lens, the first member being rotatable with respect to the second member to selectively adjust a distance between the positive convex-planar and negative planar-convex lenses.

9. An apparatus for projecting light toward a target, comprising:
   a light source that emits a beam toward the target;
   a first lens positioned in the beam and having a positive convex portion and a first planar portion, the positive convex portion refracting a central circular portion of the beam along a convergent path toward a first focal point, and the first planar portion unrefractively transmitting an outer annular portion of the beam; and
   a second lens positioned in the beam and having a negative convex portion and a second planar portion, the second planar portion transmitting the outer annular portion of the beam to form a targeting dot at the target, the negative convex portion refracting at least part of the central circular portion to form a relatively larger illuminating footprint on the target, the second lens being coupled to a translating mount configured to translate the second lens relative to the first lens.

10. The apparatus according to claim 9 wherein the first focal point is downstream of the target.

11. The apparatus according to claim 9 wherein the first lens has an opening therethrough, the second lens extending at least partially into the opening.

12. The apparatus according to claim 9 wherein the illuminating footprint is diverging at the target.

13. The apparatus according to claim 9, further comprising a housing having a first member coupled to the first lens and a second member coupled to the second lens, the first member being rotatable with respect to the second member to selectively adjust a distance between the first and second lenses.

14. A method of illuminating and targeting an object, comprising:
   projecting a beam of light toward the object;
   refracting an inner portion of the beam along a converging path toward a first focal point;
   adjusting a position of the first focal point;
   transmitting a second portion of the beam to form a targeting spot on the object, the second portion being at least initially annularly disposed about the inner portion; and
   divergingly refracting the converging inner portion of the beam to form a relatively larger illuminating footprint on the object.

15. The method according to claim 14 wherein refracting an inner portion of the beam comprises refracting an inner portion of the beam such that the first focal point is coincident with the object.

16. The method according to claim 14 wherein refracting an inner portion of the beam comprises refracting an inner portion of the beam using a positive-convex lens, and wherein divergingly refracting the converging inner portion of the beam comprises divergingly refracting the converging inner portion of the beam using a negative-convex lens.

17. The method according to claim 14 wherein refracting an inner portion of the beam comprises refracting an inner portion of the beam using a positive-convex lens, and wherein divergingly refracting the converging inner portion of the beam comprises divergingly refracting the converging inner portion of the beam using a positive-convex lens.

18. The method according to claim 14 wherein adjusting a position of the first focal point comprises translating a lens relative to a light source.

19. The method according to claim 14 wherein refracting an inner portion comprises refracting an inner portion with a first lens, and wherein divergingly refracting the converging inner portion comprises divergingly refracting the converging inner portion with a second lens, the method further comprising adjusting a distance between the first and second lenses to adjust a size of the illuminating footprint on the object.

* * * * *

UNITED STATES PATENT AND TRADEMARK OFFICE
CERTIFICATE OF CORRECTION

PATENT NO. : 6,714,564 B1
DATED : March 30, 2004
INVENTOR(S) : Brad E. Meyers

It is certified that error appears in the above-identified patent and that said Letters Patent is hereby corrected as shown below:

Column 4,
Line 14, reads "FIGS. 2 and 3. Beam" should read -- FIGS. 2 and 3, beam --

Column 6,
Lines 45-49, reads "a light source emitting a beam toward the target; a positive convex-planar lens positioned in the beam that refracts a first portion of the beam along a convergent path to a first focal point and that transmits an unrefracted second portion of the beam; and" should read -- a light source emitting a beam toward the target; a collimating lens positioned in the beam that collimates the beam; a positive convex-planar lens positioned in the beam downstream of the collimating lens that refracts a first portion of the beam along a convergent path to a first focal point and that transmits an unrefracted second portion of the beam; and --
Line 54, reads "the second portion to form a" should read -- the second portion of the beam to form a --

Column 7,
Lines 25-41, reads "a light source that emits a beam toward the target; a first lens positioned in the beam and having a positive convex portion and a first planar portion, the positive convex portion refracting a central circular portion of the beam along a convergent path toward a first focal point, and the first planar portion unrefractively transmitting an outer annular portion of the beam; and a second lens positioned in the beam and having a negative convex portion and a second planar portion, the second planar portion transmitting the outer annular portion of the beam to form a targeting dot at the target, the negative convex portion refracting at least part of the central circular portion to form a relatively larger illuminating footprint on the target, the second lens being coupled to a translating mount configured to translate the second lens relative to the first lens." should read -- a light source that emits a beam toward the target; a collimating lens positioned in the beam that collimates the beam into a collimated beam; a first lens positioned in the collimated beam and having a positive convex portion and a first planar portion, the positive convex portion refracting a central circular portion of the collimated beam along a convergent path toward a first focal point, and the first planar portion unrefractively transmitting an outer annular portion of the collimated beam; and a second lens positioned in the beam and having a negative convex portion and a second planar portion, the second planar portion transmitting the outer annular portion of the collimated beam to form a targeting dot at the target, the negative convex portion refracting at least part of the central circular portion of the collimated beam to form a relatively larger illuminating footprint on the target, the second lens being

UNITED STATES PATENT AND TRADEMARK OFFICE
CERTIFICATE OF CORRECTION

PATENT NO.    : 6,714,564 B1
DATED         : March 30, 2004
INVENTOR(S)   : Brad E. Meyers It is certified that error appears in the above-identified patent and that said Letters Patent is hereby corrected as shown below:

Column 7, lines 25-41 cont.,
coupled to a translating mount configured to translate the second lens relative to a first lens. --

Signed and Sealed this

Nineteenth Day of October, 2004

JON W. DUDAS
*Director of the United States Patent and Trademark Office*